United States Patent
Park et al.

(10) Patent No.: US 11,431,830 B2
(45) Date of Patent: Aug. 30, 2022

(54) CIRCUIT BOARD INCLUDING CONDUCTIVE STRUCTURE FOR ELECTRICALLY CONNECTING WIRES, AND ELECTRONIC DEVICE INCLUDING SAME

(71) Applicant: SAMSUNG ELECTRONICS CO., LTD., Suwon-si (KR)

(72) Inventors: Junghoon Park, Suwon-si (KR); Dongyup Lee, Suwon-si (KR); Hyunseok Kim, Suwon-si (KR); Yongseung Yi, Suwon-si (KR); Hoyeong Lim, Suwon-si (KR); Seunggoo Kang, Suwon-si (KR); Dongil Son, Suwon-si (KR); Hyangbok Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/977,617

(22) PCT Filed: Mar. 8, 2019

(86) PCT No.: PCT/KR2019/002751
§ 371 (c)(1),
(2) Date: Sep. 2, 2020

(87) PCT Pub. No.: WO2019/172719
PCT Pub. Date: Sep. 12, 2019

(65) Prior Publication Data
US 2021/0044681 A1   Feb. 11, 2021

(30) Foreign Application Priority Data

Mar. 8, 2018 (KR) .................. 10-2018-0027309

(51) Int. Cl.
*H05K 7/10* (2006.01)
*H05K 7/12* (2006.01)
(Continued)

(52) U.S. Cl.
CPC .......... *H04M 1/026* (2013.01); *G06F 1/1652* (2013.01); *H05K 1/02* (2013.01)

(58) Field of Classification Search
None
See application file for complete search history.

(56) References Cited

U.S. PATENT DOCUMENTS

| | | | |
|---|---|---|---|
| 7,928,538 B2 * | 4/2011 | Salzman | H05K 9/0039 257/659 |
| 8,026,584 B2 * | 9/2011 | Kim | H01L 23/49827 257/686 |

(Continued)

FOREIGN PATENT DOCUMENTS

| | | |
|---|---|---|
| JP | 05-073981 | 10/1993 |
| JP | 11-126951 | 5/1999 |

(Continued)

OTHER PUBLICATIONS

International Search Report for PCT/KR2019/002751, dated Jun. 13, 2019, 5 pages.

(Continued)

*Primary Examiner* — Tuan A Tran
(74) *Attorney, Agent, or Firm* — Nixon & Vanderhye, P.C.

(57) ABSTRACT

Disclosed are various embodiments relating to a circuit board included in an electronic device and, according to one embodiment, the circuit board can comprise: at least one wire included on the circuit board, at least one conductive structure arranged on the circuit board in order to reinforce the circuit board, and arranged in order to electrically (Continued)

connect the at least one wire; and at least one conductive member included on the circuit board, and electrically connecting the at least one wire with the at least one conductive structure, and additional other various embodiments are possible.

13 Claims, 9 Drawing Sheets

(51) Int. Cl.
    *H01L 23/552*     (2006.01)
    *H01L 23/498*     (2006.01)
    *H01L 23/31*     (2006.01)
    *H04M 1/02*     (2006.01)
    *G06F 1/16*     (2006.01)
    *H05K 1/02*     (2006.01)

(56) References Cited

U.S. PATENT DOCUMENTS

| | | | |
|---|---|---|---|
| 8,897,028 B2 * | 11/2014 | Takemura | H01L 23/552 361/777 |
| 9,064,838 B2 * | 6/2015 | Ibrahim | H01L 21/56 |
| 9,721,903 B2 * | 8/2017 | Lee | H01L 23/5226 |
| 10,104,763 B2 * | 10/2018 | Lee | H05K 7/20454 |
| 10,115,677 B2 * | 10/2018 | Lee | H01L 24/97 |
| 10,306,816 B2 * | 5/2019 | Mun | H05K 1/111 |
| 10,368,448 B2 * | 7/2019 | Gavagnin | H05K 3/4611 |
| 10,418,687 B2 * | 9/2019 | Mow | H01Q 21/065 |
| 10,522,475 B2 * | 12/2019 | Lee | H01L 23/552 |
| 2002/0060085 A1 | 5/2002 | Baba et al. | |
| 2009/0012858 A1 | 1/2009 | Cohen et al. | |
| 2015/0102892 A1 | 4/2015 | Yeo et al. | |
| 2019/0067208 A1 * | 2/2019 | Lin | H01L 23/49838 |

FOREIGN PATENT DOCUMENTS

| | | |
|---|---|---|
| JP | 2005-136272 | 5/2005 |
| JP | 2006-013235 | 1/2006 |
| JP | 2008-177379 | 7/2008 |
| KR | 10-2001-0021335 | 3/2001 |
| KR | 10-2010-0134338 | 12/2010 |
| KR | 10-1354372 | 1/2014 |

OTHER PUBLICATIONS

Written Opinion of the ISA for PCT/KR2019/002751, dated Jun. 13, 2019, 5 pages.

Extended European Search Report dated Mar. 13, 2021 in counterpart EP Application No. 19763199.7.

* cited by examiner

CIRCUIT BOARD INCLUDING CONDUCTIVE STRUCTURE FOR ELECTRICALLY CONNECTING WIRES, AND ELECTRONIC DEVICE INCLUDING SAME

CROSS-REFERENCE TO RELATED APPLICATION(S)

This application is a National Phase Entry of PCT international Application No. PCT/KR2019/002751, which was filed on Mar. 8, 2019, and claims priority to Korean Patent Application No. 10-2018-0027309 filed on Mar. 8, 2018, in the Korean Intellectual Property Office, the contents of which are incorporated herein by reference.

BACKGROUND

1. Field

Various embodiments of the disclosure relate to a circuit board and an electronic device including the circuit board.

2. Description to the Related Art

Electronic devices may refer to devices, such as electronic notebooks, portable multimedia players, mobile communication terminals, tablet PCs, image/sound devices, desktop/laptop computers, and vehicular navigation systems, including home appliances, which perform specific functions according to programs installed therein. For example, an electronic device may output stored information in the form of sounds or images.

Accordingly, users constantly carry the electronic devices, and the slimness and light weight of the electronic devices has become one of the main requirements thereof. Meanwhile, circuit boards have become thinner to satisfy the demand for slimness and light weight of the electronic devices, and accordingly, the circuit boards are severely influenced even by small impacts to the electronic devices.

SUMMARY

The circuit boards may be easily bent or broken by a force applied from the outside when the width of the circuit boards are small, it is difficult to secure sufficient widths for wiring lines for installing the wiring lines on the circuit boards, and an electrical short circuit and noise may be generated due to the interferences between the wiring lines when the wiring lines are disposed in narrow spaces of the circuit boards.

Accordingly, various embodiments of the disclosure relate to a circuit board that reinforces a circuit board by using at least one conductive structure disposed on the circuit board or electrically connects wiring lines included on a circuit board, and an electronic device including the circuit board.

Meanwhile, the technical objectives that are to be accomplished by various embodiments of the disclosure are not limited to the aforementioned ones, and other technical objectives may be present.

According to various embodiments of the disclosure, a circuit board may include: at least one wiring line disposed in the circuit board; at least one conductive structure disposed on the circuit board to reinforce the circuit board; and at least one conductive member disposed in the circuit board and electrically connecting the at least one wiring line and the at least one conductive structure.

According to various embodiments of the disclosure, an electronic device including a circuit board may include: a housing including a front plate, a rear plate facing a direction that is opposite to the front plate, and a side surface surrounding a space between the front plate and the rear plate; a circuit board disposed in the interior of the housing and including at least one electronic component; at least one wiring line disposed in the circuit board; at least one conductive structure disposed on the circuit board to reinforce the circuit board; and at least one conductive member disposed in the circuit board and electrically connecting the at least one wiring line and the at least one conductive structure.

According to various embodiments of the disclosure, the circuit board may include: at least one wiring line disposed in the circuit board; and at least one conductive structure disposed in the circuit board to reinforce the circuit board and disposed to electrically connect the at least one wiring line.

According to at least any one of the technical solutions of the disclosure, the strength of a circuit board can be improved by providing at least one conductive structure that reinforces the circuit board or electrically connects wiring lines, on the circuit board, and a space for wiring lines for installing the wiring lines on the circuit board can be secured by using at least one conductive structure as the wiring lines on the circuit board having a narrow width, and accordingly, the efficiency of use of space on the circuit board can be improved and an electrical short circuit between the wiring lines and noise due to the small intervals between the wiring lines in the space having the narrow width smaller can be prevented.

DETAILED DESCRIPTION

Figure 1A:
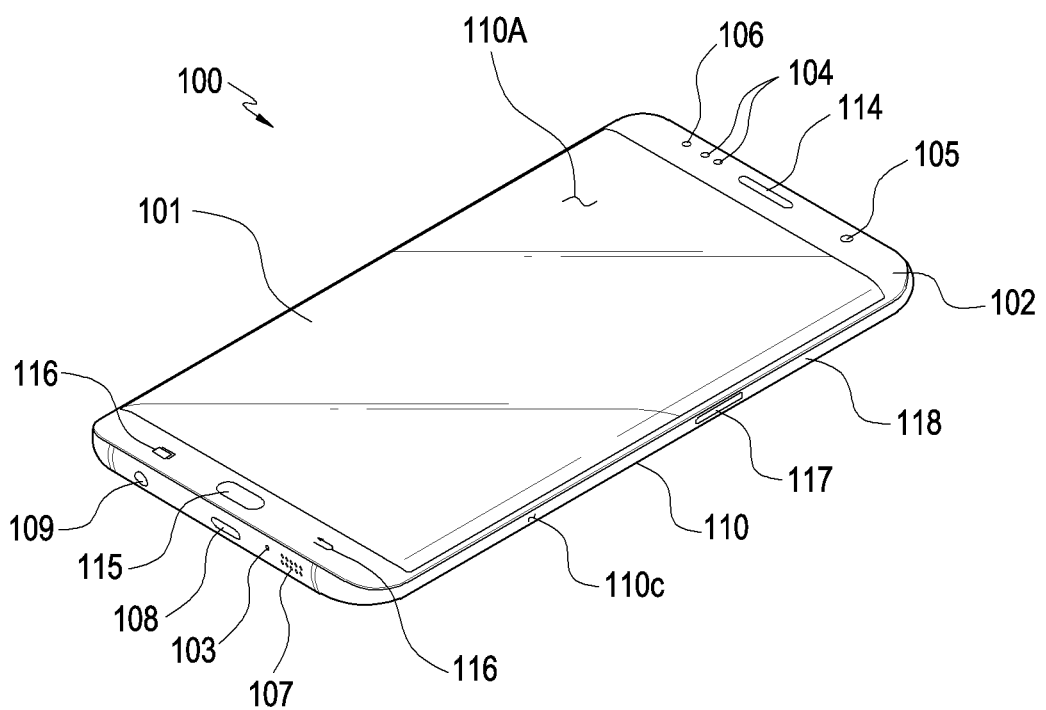
FIG. 1A is a front view illustrating an electronic device including a circuit board according to various embodiments of the disclosure.

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular expression may include a plural expression, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. Such terms as "1st" and "2nd," or "first" and "second" may represent corresponding components regardless of order or importance, may be used to simply distinguish one component from another, and do not limit the corresponding components. When it is described that an element (e.g., a first element) is "(operatively or communicatively) coupled with/to" or "connected" to another element (e.g., a second element), the element can be directly connected to the other element or can be connected to the other element through another element (e.g., a third element).

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, the module may be implemented as an application-specific integrated circuit (ASIC).

Various embodiments as set forth herein may be implemented as software (e.g., the program 240) including an instruction that is stored in a machine-readable storage medium (e.g., internal memory 236 or external memory 238) that is readable by a machine (e.g., a computer). The machine is a device capable of invoking the stored instruction and operating according to the invoked instruction, and may include the electronic device (e.g., the electronic device 201) according to the embodiments set forth herein. When the instruction is executed by the processor (e.g., the processor 220), the processor may perform functions corresponding to the instruction directly, or functions corresponding to the instruction can be performed using other components under the control of the processor. The instruction may include a code generated by a complier or a code executable by an interpreter. The machine-readable storage medium may be provided in the form of a non-transitory storage medium. Wherein, the term "non-transitory" simply means that the storage medium is a tangible device, and does not include a signal, but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed online via an application store (e.g., Play Store™). If distributed online, at least part of the computer program product may be temporarily generated or at least temporarily stored in the machine-readable storage medium, such as memory of the manufacturer's server, a server of the application store, or a relay server.

Each component (e.g., a module or a program) according to various embodiments may include a single entity or multiple entities. Some of the above-described sub-components may be omitted, or one or more other sub-components may be added to various embodiments. Alternatively or additionally, some components (e.g., modules or programs) may be integrated into a single entity, and the single entity may still perform one or more functions of each of some components in the same or similar manner as they are performed by a corresponding one of some components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 1B:
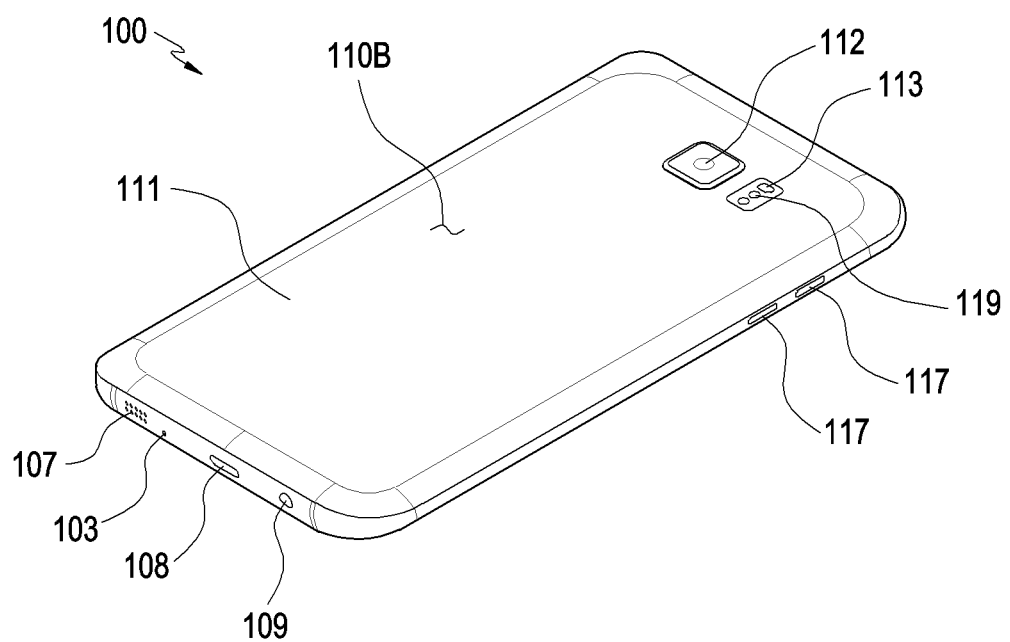
FIG. 1B is a rear view illustrating an electronic device including a circuit board according to various embodiments of the disclosure.

Referring to FIGS. 1A and 1B, an electronic device 100 according to an embodiment may include a housing 110 including a first surface (or a front surface) 110A, a second surface (or a rear surface) 110B, and a side surface 110C surrounding a space between the first surface 110A and the second surface 110B. In another embodiment (not illustrated), the housing may refer to a structure that defines some of the first surface 110A, the second surface 110B, and the side surface 110C of FIG. 1. According to an embodiment, the first surface 110A may be defined by a front plate 102 (e.g., a glass plate or a polymer plate including various coating layers), at least a portion of which is substantially transparent. The second surface 110B may be formed by a rear plate 111 that is substantially opaque. The rear plate 111, for example, may be formed of coated or colored glass, ceramics, a polymer, a metal (e.g., aluminum, stainless steel (STS), or magnesium), or a combination of at least two thereof. The side surface 110C is coupled to the front plate 102 and the rear plate 111, and may be defined by a side bezel structure (or 'a side member') 118 including a metal and/or a polymer. In some embodiments, the rear plate 111 and the side bezel structure 118 may be integrally formed and may include the same material (e.g., a metallic material such as aluminum).

In the illustrated embodiment, the front plate 102 may include first areas 110D that are deflected from the first surface 110A toward the rear plate 111 and extend seamlessly, at opposite ends of a long edge of the front plate 102. In the illustrated embodiment (see FIG. 2), the rear plate 111 may include second areas 110E that are deflected from the second surface 110B toward the front plate 102 and extend seamlessly, at opposite ends of a long edge of the rear plate 111. In some embodiments, the front plate or the rear plate may include only one of the first area or the second area. In the embodiments, when viewed from a side of the electronic device, the side bezel structure may have a first thickness (or width) on a side surface that includes neither the first area nor the second area, and may have a second thickness that is smaller than the first thickness on a side that includes the first area or the second area.

According to an embodiment, the electronic device 100 may include at least one of a display 101, audio modules 103, 107, 114, sensor modules 104 and 119, camera modules 105, 112, and 113, a key input device 115, 116, and 117, an indicator 106, and connector holes 108 and 109. In some embodiments, at least one (e.g., the key input device 115, 116, and 117 or the indicator 106) of the elements may be omitted from the electronic device 100 or another component may be additionally included in the electronic device 100.

The display 101, for example, may be exposed through a corresponding portion of the front plate 102. In some embodiments, at least a portion of the display 101 may be exposed through the front plate 102 that defines the first surface 110A, and the first areas 110D of the side surface 110C. The display 101 may be coupled to or be disposed to be adjacent to a touch detection circuit, a pressure sensor that may measure the strength (the pressure) of a touch, and/or a digitizer that detects a stylus pen of a magnetic field type. In some embodiments, at least a portion of the sensor modules 104 and 119 and/or at least a portion of the key input device 115, 116, and 117 may be disposed in the first areas 110D and/or the second areas 110E.

The audio modules 103, 107, 114 may include a microphone hole 103 and speaker holes 107 and 114. A microphone for acquiring external sounds may be disposed in the microphone hole 103, and in some embodiments, a plurality of microphones may be disposed to detect the direction of a sound. The speaker holes 107 and 114 may include an external speaker hole 107 and a communication receiver hole 114. In some embodiments, the speaker hole 107 and 114 and the microphone hole 103 may be realized by one hole or a speaker may be included while a speaker hole 107 and 114 is not employed (e.g., a piezoelectric speaker).

The sensor modules 104 and 119 may generate an electrical signal or a data value corresponding to an operational state of the interior of the electronic device 100 or an environmental state of the outside. The sensor modules 104 and 119, for example, may include a first sensor module 104 (e.g., a proximity sensor) and a second sensor module (not illustrated) (e.g., a fingerprint sensor) disposed on the first surface 110A of the housing 110, and/or a third sensor module 119 (e.g., a HRM sensor) disposed on the second surface 110B of the housing 110. The fingerprint sensor may be disposed not only on the first surface 110A (e.g., a home key button 115) but also the second surface 110B of the housing 110. The electronic device 100 may further include a sensor module (not illustrated), for example, at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illumination sensor 104.

The camera modules 105, 112, and 113 may include a first camera device 105 disposed on the first surface 110A of the electronic device 100, and a second camera device 112 and/or a flash 113 disposed on the second surface 110B. The camera modules 105 and 112 may include one or a plurality of lenses, an image sensor, and/or an image signal processor. The flash 113, for example, may include a light emitting diode or a xenon lamp. In some embodiments, two or more lenses (a wide angle/telephoto lens), and image sensors may be disposed on one surface of the electronic device 100.

The key input devices 115, 116, and 117 may include a home key button 115 disposed on the first surface 110A of the housing 110, a touch pad 116 disposed around the home key button 115, and/or a side key button 117 disposed on the side surface 110C of the housing 110. In another embodiment, the electronic device 100 may not include some or all of the above-mentioned key input devices 115, 116, and 117, and the key input devices 115, 116, and 117 which are not included, may be realized in different forms, such as a soft key, on the display 101.

The indicator 106, for example, may be disposed on the first surface 110A of the housing 110. The indicator 106, for example, may provide state information on the electronic device 100 in the form of light, and may include an LED.

The collector holes 108 and 109 may include a first connector hole 108 that may accommodate a connector (e.g., a USB connector) for transmitting and receiving electric power and/or data to and from an external electronic device and/or a second connector hole (or an earphone jack) 109 that may accommodate a connector for transmitting and receiving an audio signal to and from the external device.

Figure 1C:
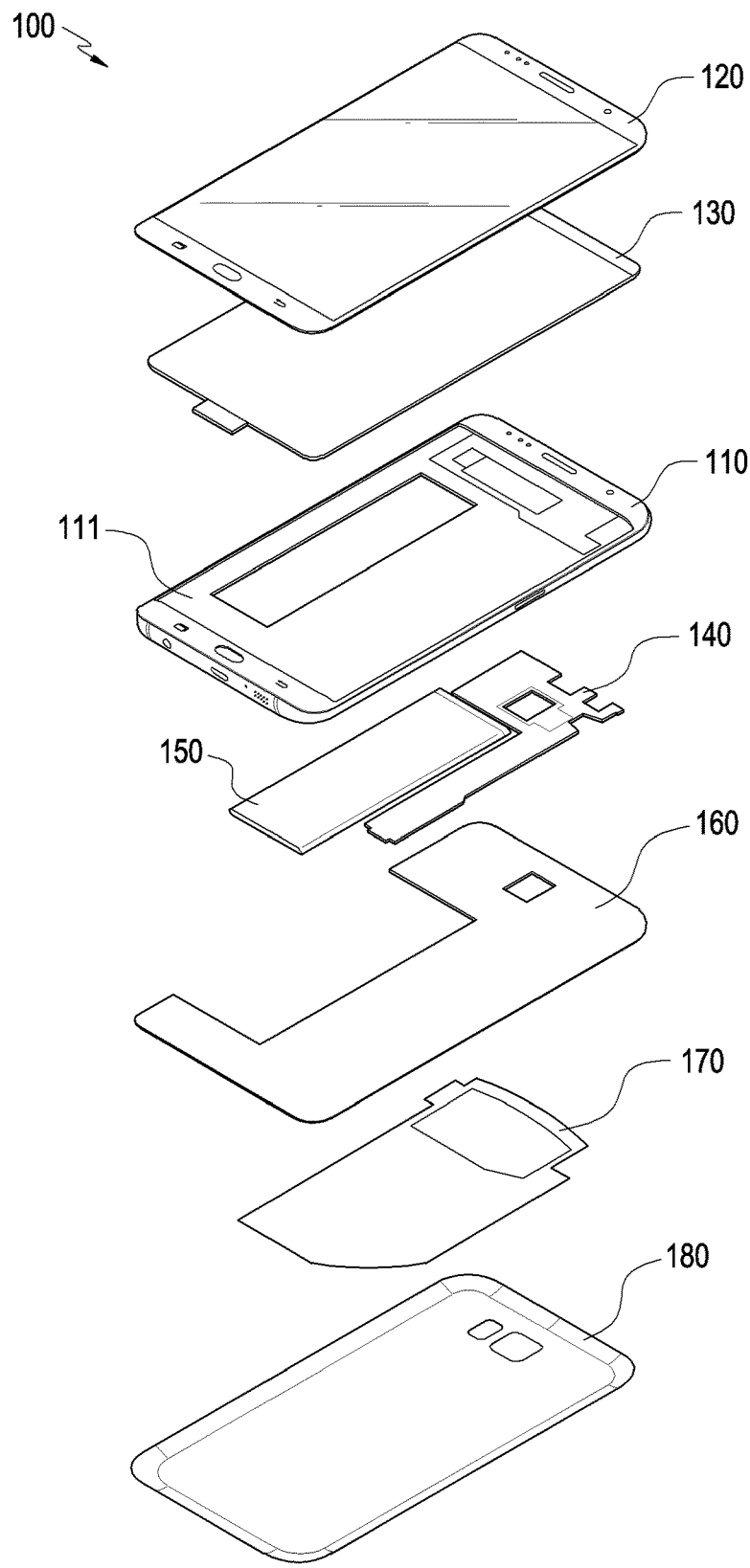
FIG. 1C is an exploded perspective view illustrating an electronic device including a circuit board according to various embodiments of the disclosure.

Referring to FIG. 1C, an electronic device 100 may include a side bezel structure 110, a first support member 111 (e.g., a bracket), a front plate 120, a display 130, a printed circuit board 140, a battery 150, a second support member 160 (e.g., a rear case), an antenna 170, and a rear plate 180. In some embodiments, at least one (e.g., the first support member 111 or the second support member 160) of the elements may be omitted from the electronic device 100 or another component may be additionally included in the electronic device 100. At least one of the components of the electronic device 100 may be the same as or similar to at least one of the components of the wearable electronic device 100 of FIGS. 1A and 1B, and a repeated description thereof will be omitted.

The first support member 111 may be disposed in the interior of the wearable electronic device 100 to be connected to the side bezel structure 110 or to be integrally formed with the side bezel structure 110. The first support member 111, for example, may be formed of a metallic material and/or a nonmetallic material (e.g., a polymer). The display 130 may be coupled to one surface of the first support member 111, and the printed circuit board 140 may be coupled to an opposite surface of the first support member 311. A processor, a memory, and/or an interface may be mounted on the printed circuit board 140. The processor, for example, may include one or more of a central processing unit, an application processor, a graphic processing unit, an image signal processor, a sensor hub processor, or a communication processor.

The memory, for example, may include a volatile and/or nonvolatile memory.

The interface, for example, may include a high definition multimedia interface (HDMI), a universal serial bus (USB), an SD card interface, and/or an audio interface. The interface, for example, may electrically or physically connect the electronic device 100 to an external electronic device, and may include a USB connector, an SD card/MMC connector, and an audio connector.

The battery 150 is a device for supplying electric power to at least one component of the electronic device 100, and for example, may include a primary battery that cannot be recharged, a secondary battery that may be recharged, or a fuel cell. At least a portion of the battery 150, for example, may be disposed on substantially the same plane as the printed circuit board 140. The battery 150 may be integrally disposed in the interior of the electronic device 100, and may be disposed to be detachable from the electronic device 100.

The antenna 170 may be disposed between the rear plate 180 and the battery 150. The antenna 170, for example, may include a near field communication (NFC) antenna, a wireless charging antenna, and/or a magnetic secure transmission (MST) antenna. The antenna 170, for example, may perform short-range communication with an external device, or may wirelessly transmit and receive electric power that is necessary for charging. In another embodiment, an antenna structure may be formed by one or a combination of the side bezel structure 110 and/or the first support member 111.

Figure 2:
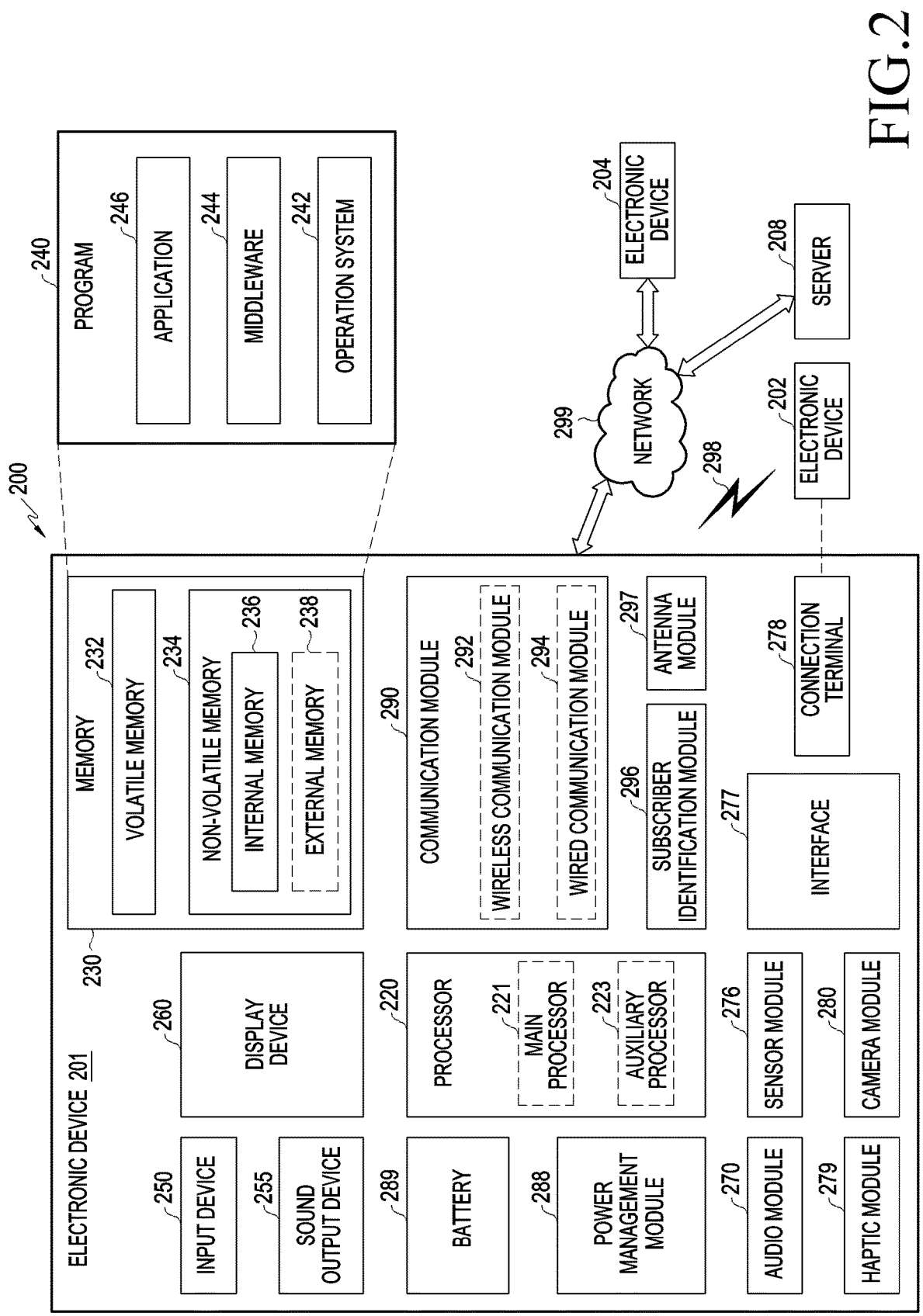
FIG. 2 is a block diagram of an electronic device in a network environment according to various embodiments of the disclosure.

FIG. 2 is a block diagram illustrating an electronic device 201 (e.g., the electronic device 100) in a network environment 200 according to various embodiments. Referring to FIG. 2, the electronic device 201 in the network environment 200 may communicate with an electronic device 202 via a first network 298 (e.g., a short-range wireless communication network), or an electronic device 204 or a server 208 via a second network 299 (e.g., a long-range wireless communication network). According to an embodiment, the electronic device 201 (e.g., the electronic device 100) may communicate with the electronic device 204 via the server 208. According to an embodiment, the electronic device 201 (e.g., the electronic device 100) may include a processor 220, memory 230, an input device 250, a sound output device 255, a display device 260, an audio module 270, a sensor module 276, an interface 277, a haptic module 279, a camera module 280, a power management module 288, a battery 289, a communication module 290, a subscriber identification module (SIM) 296, or an antenna module 297. In some embodiments, at least one (e.g., the display device 260 or the camera module 280) of the components may be omitted from the electronic device 201 (e.g., the electronic device 100), or one or more other components may be added in the electronic device 201. In some embodiments, some of the components may be implemented as single integrated circuitry. For example, the sensor module 276 (e.g., a fingerprint sensor, an iris sensor, or an illuminance sensor) may be implemented as embedded in the display device 260 (e.g., a display).

The processor 220 may execute, for example, software (e.g., a program 240) to control at least one other component (e.g., a hardware or software component) of the electronic device 201 (e.g., the electronic device 100) coupled with the processor 220, and may perform various data processing or computation. According to one embodiment, as at least part of the data processing or computation, the processor 220 may load a command or data received from another component (e.g., the sensor module 276 or the communication module 290) in volatile memory 232, process the command or the data stored in the volatile memory 232, and store resulting data in non-volatile memory 234. According to an embodiment, the processor 220 may include a main processor 221 (e.g., a central processing unit (CPU) or an application processor (AP)), and an auxiliary processor 223 (e.g., a graphics processing unit (GPU), an image signal processor (ISP), a sensor hub processor, or a communication processor (CP)) that is operable independently from, or in conjunction with, the main processor 221. Additionally or alternatively, the auxiliary processor 223 may be adapted to consume less power than the main processor 221, or to be specific to a specified function. The auxiliary processor 223 may be implemented as separate from, or as part of the main processor 221.

The auxiliary processor 223 may control, for example, at least some of functions or states related to at least one component (e.g., the display device 260, the sensor module 276, or the communication module 290) among the components of the electronic device 201 (e.g., the electronic device 100), instead of the main processor 221 while the main processor 221 is in an inactive (e.g., sleep) state, or together with the main processor 221 while the main processor 221 is in an active (e.g., executing an application) state. According to an embodiment, the auxiliary processor 223 (e.g., an image signal processor or a communication processor) may be implemented as part of another component (e.g., the camera module 280 or the communication module 290) functionally related to the auxiliary processor 223.

The memory 230 may store various data used by at least one component (e.g., the processor 220 or the sensor module 276) of the electronic device 201 (e.g., the electronic device 100). The various data may include, for example, software (e.g., the program 240) and input data or output data for a command related thereto. The memory 230 may include the volatile memory 232 or the non-volatile memory 234.

The program 240 may be stored in the memory 230 as software, and may include, for example, an operating system (OS) 242, middleware 244, or an application 246.

The input device 250 may receive a command or data to be used by a component (e.g., the processor 220) of the electronic device 201 (e.g., the electronic device 100), from the outside (e.g., a user) of the electronic device 201 (e.g., the electronic device 100). The input device 250 may include, for example, a microphone, a mouse, or a keyboard.

The sound output device 255 may output sound signals to the outside of the electronic device 201 (e.g., the electronic device 100). The sound output device 255 may include, for example, a speaker or a receiver. The speaker may be used for general purposes, such as playing multimedia or playing record, and the receiver may be used for incoming calls. According to an embodiment, the receiver may be implemented as separate from, or as part of the speaker.

The display device 260 may visually provide information to the outside (e.g., a user) of the electronic device 201 (e.g., the electronic device 100). The display device 260 may include, for example, a display, a hologram device, or a projector and control circuitry to control a corresponding one of the display, hologram device, and projector. According to an embodiment, the display device 260 may include touch circuitry adapted to detect a touch, or sensor circuitry (e.g., a pressure sensor) adapted to measure the intensity of force incurred by the touch.

The audio module 270 may convert a sound into an electrical signal and vice versa. According to an embodiment, the audio module 270 may obtain the sound via the input device 250, or output the sound via the sound output device 255 or an external electronic device (e.g., an electronic device 202 (e.g., a speaker or a headphone)) directly or wirelessly coupled with the electronic device 201 (e.g., the electronic device 100).

The sensor module 276 may detect an operational state (e.g., power or temperature) of the electronic device 201 or an environmental state (e.g., a state of a user) external to the electronic device 201, and then generate an electrical signal or data value corresponding to the detected state. According to an embodiment, the sensor module 276 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 277 may support one or more specified protocols to be used for the electronic device 201 (e.g., the electronic device 100) to be coupled with the external electronic device (e.g., the electronic device 202) directly or wirelessly. According to an embodiment, the interface 277 may include, for example, a high definition multimedia interface (HDMI), a universal serial bus (USB) interface, a secure digital (SD) card interface, or an audio interface.

A connecting terminal 278 may include a connector via which the electronic device 201 (e.g., the electronic device 100) may be physically connected with the external electronic device (e.g., the electronic device 202). According to an embodiment, the connecting terminal 278 may include, for example, a HDMI connector, a USB connector, a SD card connector, or an audio connector (e.g., a headphone connector).

The haptic module 279 may convert an electrical signal into a mechanical stimulus (e.g., a vibration or a movement) or electrical stimulus which may be recognized by a user via his tactile sensation or kinesthetic sensation. According to an embodiment, the haptic module 279 may include, for example, a motor, a piezoelectric element, or an electric stimulator.

The camera module 280 may capture a still image or moving images. According to an embodiment, the camera module 280 may include one or more lenses, image sensors, image signal processors, or flashes.

The power management module 288 may manage power supplied to the electronic device 201. According to one embodiment, the power management module 288 may be implemented as at least part of, for example, a power management integrated circuit (PMIC).

The battery 289 may supply power to at least one component of the electronic device 201. According to an embodiment, the battery 289 may include, for example, a primary cell which is not rechargeable, a secondary cell which is rechargeable, or a fuel cell.

The communication module 290 may support establishing a direct (e.g., wired) communication channel or a wireless communication channel between the electronic device 201 (e.g., the electronic device 100) and the external electronic device (e.g., the electronic device 202, the electronic device 204, or the server 208) and performing communication via the established communication channel. The communication module 290 may include one or more communication processors that are operable independently from the processor 220 (e.g., the application processor (AP)) and supports a direct (e.g., wired) communication or a wireless communication. According to an embodiment, the communication module 290 may include a wireless communication module 292 (e.g., a cellular communication module, a short-range wireless communication module, or a global navigation satellite system (GNSS) communication module) or a wired communication module 294 (e.g., a local area network (LAN) communication module or a power line communication (PLC) module). A corresponding one of these communication modules may communicate with the external electronic device via the first network 298 (e.g., a short-range communication network, such as Bluetooth™, wireless-fidelity (Wi-Fi) direct, or infrared data association (IrDA)) or the second network 299 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 292 may identify and authenticate the electronic device 201 (e.g., the electronic device 100) in a communication network, such as the first network 298 or the second network 299, using subscriber information (e.g., international mobile subscriber identity (IMSI)) stored in the subscriber identification module 296.

The antenna module 297 may transmit or receive a signal or power to or from the outside (e.g., the external electronic device) of the electronic device 201. According to an embodiment, the antenna module 297 may include a plurality of antennas. In such a case, at least one antenna appropriate for a communication scheme used in the communication network, such as the first network 298 or the second network 299, may be selected, for example, by the communication module 290 from the plurality of antennas. The signal or the power may then be transmitted or received between the communication module 290 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 201 (e.g., the electronic device 100) and the external electronic device 204 via the server 208 coupled with the second network 299. Each of the electronic devices 202 and 204 may be a device of a same type as, or a different type, from the electronic device 201 (e.g., the electronic device 100). According to an embodiment, all or some of operations to be executed at the electronic device 201 may be executed at one or more of the external electronic devices 202, 204, or 208. For example, if the electronic device 201 (e.g., the electronic device 100) should perform a function or a service automatically, or in response to a request from a user or another device, the electronic device 201 (e.g., the electronic device 100), instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 201 (e.g., the electronic device 100). The electronic device 201 (e.g., the electronic device 100) may provide the outcome, with or without further processing of the outcome, as at least part of a reply to the request. To that end, a cloud computing, distributed computing, or client-server computing technology may be used, for example.

Figure 3:
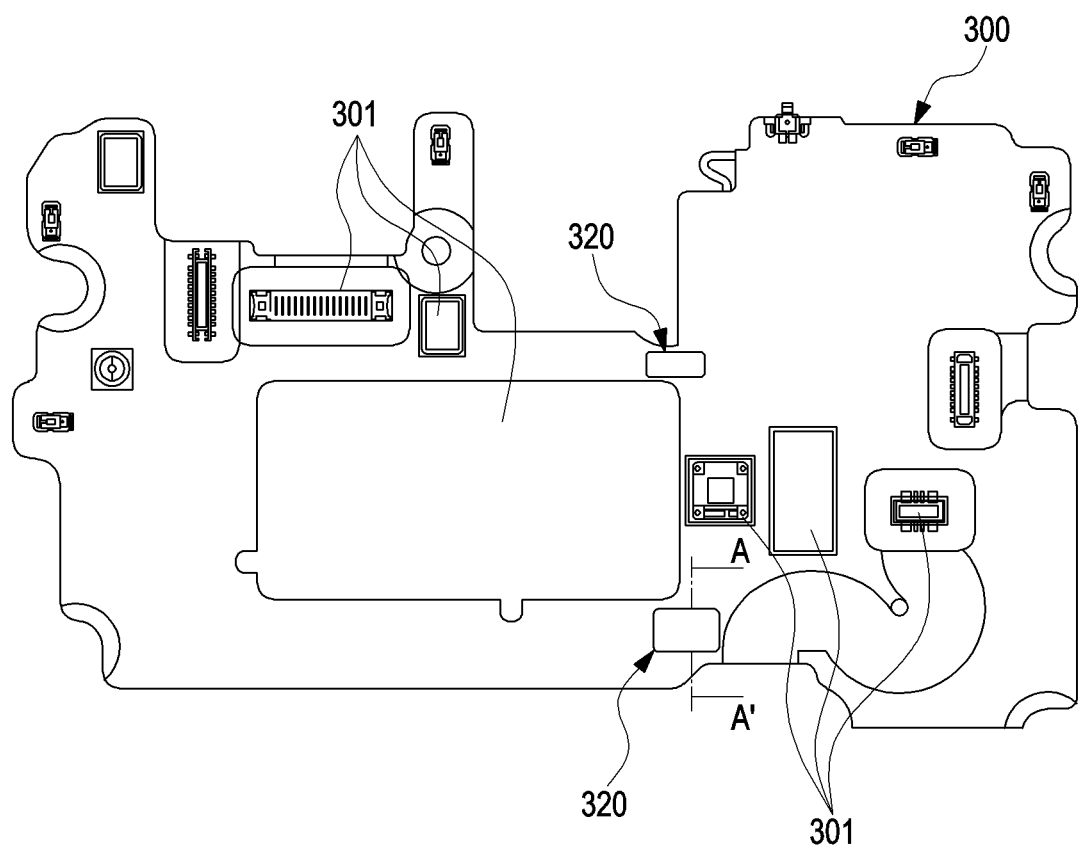
FIG. 3 is a front view illustrating a circuit board according to various other embodiments of the disclosure.
Figure 4:
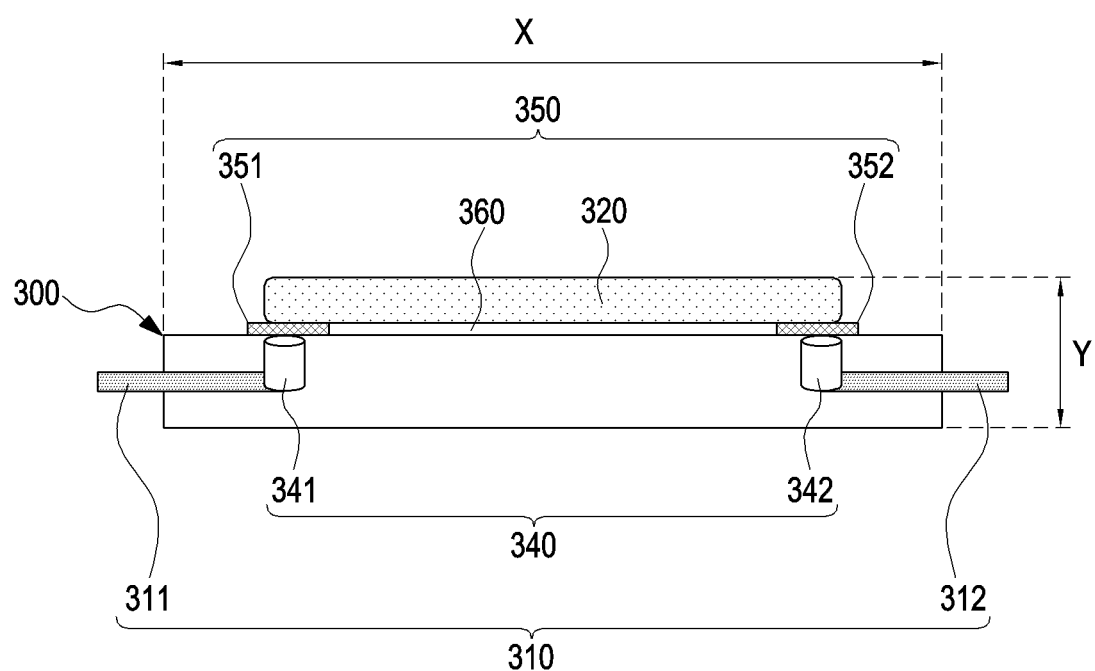
FIG. 4 is a cross-sectional view taken along line A-A' in FIG. 3.

FIG. 3 is a front view illustrating a circuit board 300 according to various other embodiments of the disclosure. FIG. 4 is a cross-sectional view taken along a line A-A of FIG. 3.

Referring to FIGS. 3 and 4, a circuit board 300 according to various embodiments may include at least one wiring line 310, at least one conductive structure 320, and at least one conductive member 340. For example, the at least one wiring line 310 may be disposed in the circuit board 300 to electrically connect electronic components 301 included on the circuit board 300. The at least one wiring line 310 may include at least one of a power signal wiring line, a control signal wiring line, or a communication signal wiring line 310, and in the present embodiment, the power signal wiring line 310 will be described as an example. The at least one conductive structure 320 may not only be disposed to reinforce the circuit board 300 but may also be disposed on the circuit board 300 to electrically connect the at least one wiring line 310. The at least one conductive member 340 may be included on the circuit board 300 to electrically connect the at least one wiring line 310 and the at least one conductive structure 320. The at least one conductive member 340 may include at least one of at least one via hole or at least one connection wiring line to electrically connect the wiring line 310 and the conductive structure 320. In the present embodiment, it will be described as an example that the at least one conductive member 340 is a via hole or a connection wiring line, but the disclosure is not limited thereto. For example, any construction that electrically connects the wiring line 310 and the conductive member 340 may be variously applied as the at least one conductive member 340.

In this way, the strength of the circuit board 300 can be improved by disposing the at least one conductive structure 320 on the circuit board 300 to reinforce the circuit board 300, and an installation space for the wire 310 on the circuit board 300 can be secured by using the at least one conductive structure 320 disposed on the circuit board 300 as the wiring line 310, and accordingly, the efficiency of use of space on the circuit board 300 can be improved and an electrical short circuit or noise generated as the interval between the wiring lines in the space having a small width X is made small.

According to an embodiment, because a wiring line 310 cannot be additionally disposed in the space having a small width (X) in the circuit board 300, the wiring line 310 has to be disposed not in the widthwise (X) direction but in the height (Y) direction, and accordingly, the circuit board 300 may be disposed such that a plurality of insulating layers (not illustrated) are stacked in the height (Y) direction. A plurality of wiring line layers (not illustrated) including at least one wiring line may be included on surfaces of the plurality of insulating layers (not illustrated). For example, the circuit board 300 may include ten wiring line layers (not illustrated), the first and second wiring line layers of the ten wiring line layers may include a power signal wiring line 310, and the fifth and seventh wiring line layers (not illustrated) may include a control signal wiring line or a communication signal wiring line. The fourth, sixth, and eighth wiring line layers (not illustrated) may include a ground layer to prevent coupling of the fifth and seventh wiring line layers (not illustrated).

At least one conductive structure 320 electrically connected to at least one wiring line 310 included on the circuit board 300 may be disposed on the circuit board 300 having the structure not in the widthwise (X) direction but the height (Y) direction of the circuit board 300. According to an embodiment, the at least one conductive structure 320 may not only be disposed to reinforce the circuit board 300 but also be used as a configuration of electrically connecting the wiring lines 310. Accordingly, the wiring line space of the circuit board 300 can be sufficiently secured.

According to an embodiment, the circuit board 300 may include any one selected from polycarbonate (PC), polymethyl methacrylate (PMMA), polyimide (PI), polyethylene terephthalate (PET), polypropylene terephthalate (PPT), amorphous polyethylene terephthalate (APET), polyethylene naphthalate terephthalate (PEN), polyethylene terephthalate glycol (PETG), tri-acetyl-cellulose (TAC), cyclic olefin polymer (COP), cyclic olefin copolymer (COC), polydicyclopentadiene (DCPD), cyclopentdienyl anions (CPD), polyarylate (PAR), polyethersulfone (PES), poly ether imide (PEI), a modified epoxy resin, or an acryl resin, or a combination of two or more thereof.

The at least one conductive structure 320 may include a reinforcing part to reinforce the circuit board 300. The reinforcing part may include at least one of steel use stainless (SUS) or lead. Any material having conduction characteristics may be variously applied as the reinforcing part. For example, the reinforcing part may include at least one of silver, copper, gold, aluminum, tungsten, zinc, nickel, steel, platinum, tin, nichrome, brass, bronze, and stainless steel.

The at least one conductive structure 320 may include at least one bonding member 350 to attach the conductive structures 320 to the circuit board 300. The at least one bonding member 350 may attach the conductive structure 320 onto the circuit board 300 and electrically connect at least one conductive member 340 disposed on the circuit board 300 and the at least one conductive structure 320. For example, the at least one bonding member 350 may include a material having conduction characteristics. For example, the bonding member 350 may include lead. The bonding member 350 is not limited to lead, and a SnAgCu alloy or low-temperature solder may be applied as a metal material for SMD.

A spacing space 360 may be disposed between the at least one conductive structure 320 and the circuit board 300 to prevent an electrical short circuit due to a contact of a mechanism (not illustrated) connected to the ground of the circuit board and the at least one conductive structure 320.

As illustrated in FIG. 4, which has been mentioned above, first and second wiring lines 311 and 312 may be disposed in the interior of the circuit board 300. A first conductive member 341 may be disposed at one end of the first wiring line 311, and a second conductive member 342 may be disposed at one end of the second wiring line 312. The first and second bonding members 351 and 352 may be applied to the first and second conductive members 341 and 342, and the conductive structure 320 may be attached to the upper surfaces of the first and second bonding members 351 and 352. Then, the conductive structure 320 may be attached to the upper surfaces of the first and second bonding members 351 and 352, and a spacing space 360 may be disposed between the first and second bonding members 351 and 352 and the circuit board 300 as well.

Accordingly, a signal of the first wiring line 310 is applied to the conductive structure 320 through the first conductive member 340 and the first bonding member 351, and the conductive structure 320 may deliver the applied signal to the second wiring line 312 through the second bonding member 352 and the second conductive member 342.

In this way, by electrically connecting the first and second wiring lines 311 and 312 by using the conductive structure 320, a space for installing the wiring line 310 on the circuit board 300 can be secured and an additional line 310 can be installed on the circuit board 300 as well. For example, a wiring line space for installing a power signal wiring line 310, a control signal wiring line 310, a communication signal wiring line, or other wiring lines 310 may be secured on the circuit board 300.

The circuit board 300 assembled in this way may be located in the interior of a housing included in the electronic device (e.g., 100 of FIG. 1A). For example, the housing of the electronic device (e.g., 100 of FIG. 1A) may include a front plate (e.g., 102 of FIG. 1A), a rear plate (e.g., 111 of FIG. 1B) facing a direction that is opposite to the front plate (e.g., 102 of FIG. 1), and a side surface (e.g., 110C of FIG. 1A) surrounding a space between the front plate (e.g., 102 of FIG. 1A) and the rear plate (e.g., 111 of FIG. 1B). The circuit board 300 may include at least one electronic component 301 included in the electronic device (e.g., 100 of FIG. 1A). The at least one electronic component 301 may be electrically connected by the at least one wiring line 310 and the at least one conductive structure 320 disposed on the circuit board 300, and the at least one electronic component 301 may be driven based on the structure.

Figure 5:
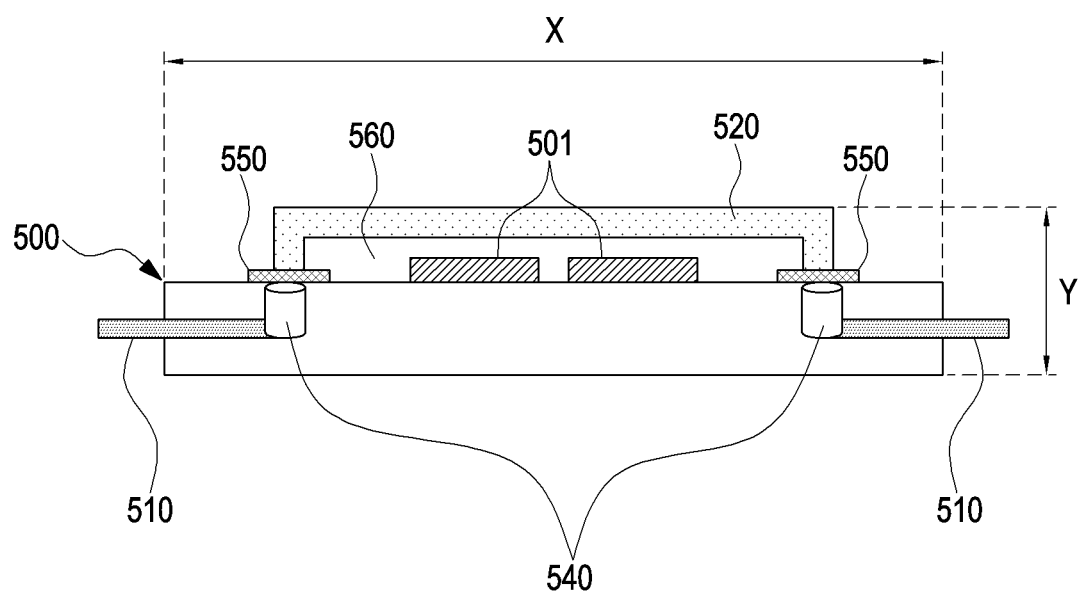
FIG. 5 is a cross-sectional view taken along line A-A' of FIG. 3, and is a view illustrating another embodiment of a circuit board including at least one conductive structure.

FIG. 5 is a cross-sectional view taken along line A-A' of FIG. 3, and is a view illustrating another embodiment of a circuit board 500 including at least one conductive structure 520.

Referring to FIG. 5, at least one conductive structure 520 may be disposed on the circuit board 500, the at least one conductive structure 520 and the circuit board 500 may be disposed to be spaced apart from each other, and a spacing space 560 may be disposed between the at least one conductive structure 520 and the circuit board 500.

At least one electronic component 501 included in the electronic device (e.g., 100 of FIG. 1C) may be disposed in the spacing space 560. At least one conductive member 500 may be disposed on the circuit board 540 to electrically connect the at least one wiring line 510 and the at least one conductive structure 520.

The at least one conductive structure 520 may be attached onto the circuit board 520 by at least one bonding member 550 not in the widthwise (X) direction but in the height (Y) direction, and the at least one bonding member 550 may electrically connect the at least one conductive structure 520 and the at least one conductive member 540.

At least some of the configurations of the at least one conductive member 540 may be similar to or the same as the conductive member (e.g., 340 of FIG. 4) described above. Accordingly, because the configurations of the conductive member 540 may be easily understood through the above-described embodiments, a detailed description thereof will be omitted.

According to an embodiment, because the at least one conductive structure 520 may be used to reinforce the circuit board 500 on the circuit board 500 and to electrically connect the wiring lines and the at least one component 501 of the electronic device (e.g., 100 of FIG. 1C) may be disposed in the spacing space 560 disposed between the conductive structure 520 and the circuit board 500 as well, the efficiency of use of space on the circuit board 500 can be further improved and the conductive structure 520 can both protect and shield the electronic components 501. For example, the conductive structure 520 may be used as a shield member that shields the electronic components 501. For example, because the conductive structure 520 shields the electronic components 501 disposed in the spacing space 560, an electrical short circuit of the electronic components (e.g., 301 of FIG. 3) disposed outside the conductive structure 520 can be prevented.

Figure 6:
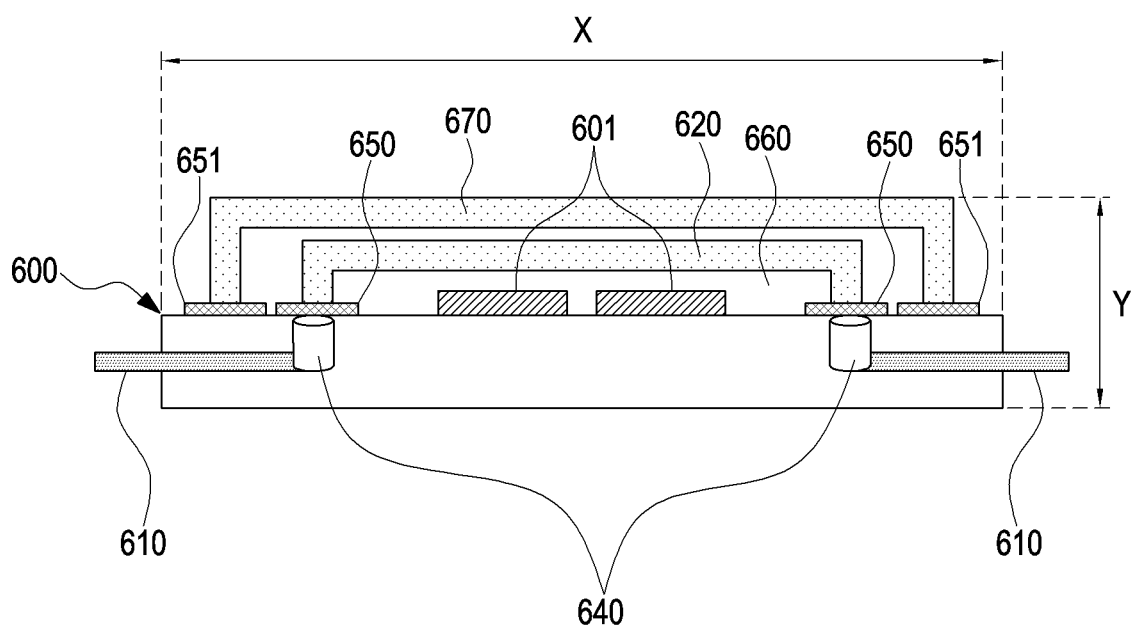
FIG. 6 is a cross-sectional view taken along line A-A' of FIG. 3, and is a view illustrating another embodiment of a circuit board including at least one conductive structure.

FIG. 6 is a cross-sectional view taken along line A-A' of FIG. 3, and is a view illustrating another embodiment of a circuit board 600 including at least one conductive structure 620.

Referring to FIG. 6, at least one conductive structure 620 may be disposed on the circuit board 600 not in the widthwise (X) direction but in the height (Y) direction, the at least one conductive structure 620 and the circuit board 600 may be disposed to be spaced apart from each other, and a spacing space 660 may be disposed between the at least one conductive structure 620 and the circuit board 600. At least one electronic component 601 included in the electronic device (e.g., 100 of FIG. 1C) may be disposed in the spacing space 660. At least one conductive member 600 may be disposed on the circuit board 640 to electrically connect the at least one wiring line 610 and the at least one conductive structure 620. An insulating cover part 670 may be disposed on a surface of the at least one conductive structure 620 to insulate and protect the conductive structure 640.

At least some of the configurations of the at least one conductive structure 620 and the at least one conductive member 640 may be similar to or the same as the at least one conductive structure (e.g., 320 of FIG. 4) and the at least one conductive member (e.g., 340 of FIG. 4). Accordingly, because the configurations of the conductive structure 620 and the conductive member 640 may be easily understood through the above-described embodiments, a detailed description thereof will be omitted.

According to an embodiment, the at least one conductive structure 620 may be attached to at least first bonding member 650 on the circuit board 600, and the first bonding member 650 may electrically connect the at least one conductive structure 620 and the at least one conductive member 640. The insulating cover part 670 may be disposed on an outer surface of the at least one conductive structure 620 and may be disposed on the circuit board 600 as well. The insulating cover part 670 may be attached onto the circuit board 600 by at least one second bonding member 651.

The insulating cover part 670 may be attached onto the circuit board 600 by the at least one second bonding member 651 and may be disposed to surround the entire surface of the at least one conductive structure 630 as well.

Accordingly, the insulating cover part 670 can electrically insulate and protect the conductive structure 620 from an external mechanism (not illustrated) disposed outside the insulating cover part 670 or electronic components 601 by preventing contact of the conductive structure 620 with the external mechanism (not illustrated) or the electronic components 601, and can prevent an electrical short circuit with the electronic component (e.g., 301 of FIG. 3) disposed outside the insulating cover part 670 by shielding the conductive structure 620 as well.

Figure 7:
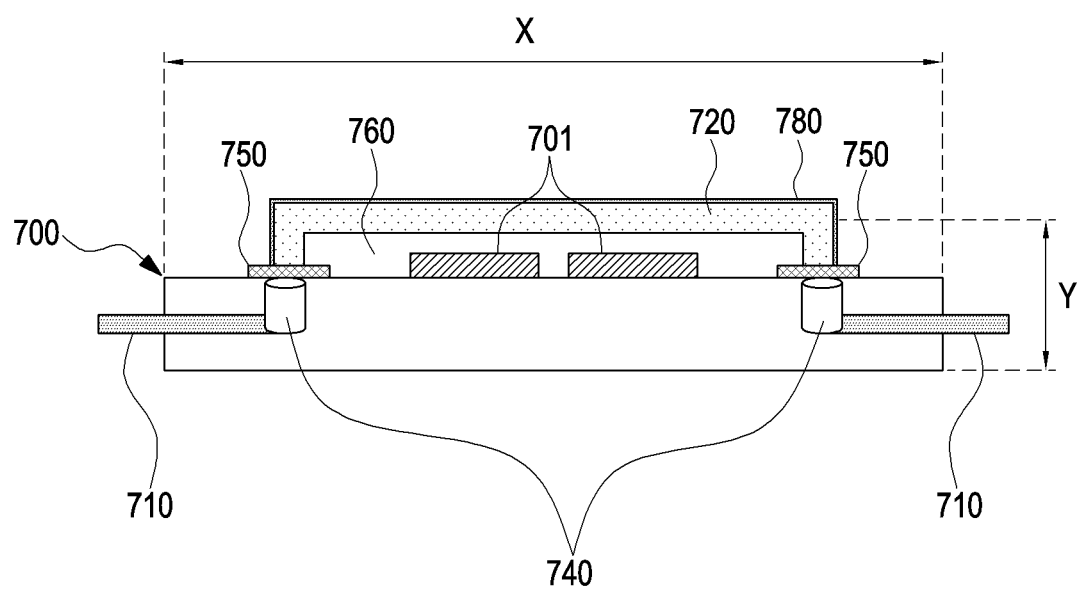
FIG. 7 is a cross-sectional view taken along line A-A' of FIG. 3, and is a view illustrating another embodiment of a circuit board including at least one conductive structure.

FIG. 7 is a cross-sectional view taken along line A-A' of FIG. 3, and is a view illustrating another embodiment of a circuit board 700 including at least one conductive structure 720.

Referring to FIG. 7, at least one conductive structure 720 may be disposed on the circuit board 700 not in the widthwise (X) direction but in the height (Y) direction, the at least one conductive structure 720 and the circuit board 700 may be disposed to be spaced apart from each other, and a spacing space 760 may be disposed between the at least one conductive structure 720 and the circuit board 700. At least one electronic component 701 included in the electronic device (e.g., 100 of FIG. 1C) may be disposed in the spacing space 760. At least one conductive member 740 may be disposed on the circuit board 700 to electrically connect the at least one wiring line 710 and the at least one conductive structure 720. The at least one conductive structure 720 may be attached onto the circuit board 700 by at least one bonding member 750, and the at least one bonding member 750 may electrically connect the at least one conductive structure 720 and the at least one conductive member 740.

An insulating printing layer 780 may be disposed on a surface of the at least one conductive structure 720 to insulate and protect the conductive structure 720.

At least some of the configurations of the at least one conductive structure 720 and the at least one conductive member 740 may be similar to or the same as the at least one conductive structure (e.g., 320 of FIG. 4) and the at least one conductive member (e.g., 340 of FIG. 4). Accordingly, because the configurations of the conductive structure 720 and the conductive member 740 may be easily understood through the above-described embodiments, a detailed description thereof will be omitted.

According to an embodiment, the insulating printing layer 780 may be printed or applied on an outer surface of the at least one conductive structure 720.

Accordingly, the insulating printing layer 780 can electrically insulate and protect the conductive structure 720 from an external mechanism (not illustrated) disposed outside the conductive structure 720 or the electronic components 701 by preventing contact of the conductive structure 720 with the external mechanism (not illustrated) or the electronic components 701, and can prevent an electrical short circuit with the electronic component (e.g., 301 of FIG. 3) disposed outside the conductive structure 720 by shielding the conductive structure 720 as well.

According to various embodiments of the disclosure, a circuit board (e.g., 300 of FIG. 4) may include: at least one wiring line (e.g., 310 of FIG. 4) disposed in the circuit board; at least one conductive structure (e.g., 320 of FIG. 4) disposed on the circuit board to reinforce the circuit board; and at least one conductive member (e.g., 340 of FIG. 4) disposed in the circuit board and electrically connecting the at least one wiring line and the at least one conductive structure.

According to various embodiments of the disclosure, the at least one wiring line may include at least one of a power signal wiring line, a control signal wiring line, or a communication signal wiring line.

According to various embodiments of the disclosure, the at least one conductive structure may include a reinforcing part to reinforce the circuit board.

According to various embodiments of the disclosure, the reinforcing part may include steel use stainless (SUS) or lead.

According to various embodiments of the disclosure, the at least one conductive member may include at least one of at least one via hole or at least one connection wiring line.

According to various embodiments of the disclosure, the at least one conductive structure may include at least one bonding member (e.g., 350 of FIG. 4) to attach the conductive structure onto the circuit board.

According to various embodiments of the disclosure, a spacing space (e.g., 360 of FIG. 4) may be disposed between the at least one conductive structure and the circuit board.

According to various embodiments of the disclosure, at least one electronic component (e.g., 501 of FIG. 5) may be disposed in the spacing space.

According to various embodiments of the disclosure, the at least one conductive structure (e.g., 520 of FIG. 5) may include a shield member configured to shield the at least one electronic component.

According to various embodiments of the disclosure, a surface of the at least one conductive structure may include at least one of an insulating cover part (e.g., 670 of FIG. 6) or an insulating printing layer (e.g., 780 of FIG. 7) that covers the conductive structure to insulate the conductive structure.

According to various embodiments of the disclosure, the at least one conductive structure may include at least one first bonding member (e.g., 650 of FIG. 6) to attach the conductive structure onto the circuit board, and the insulating cover part may include a second bonding member (e.g., 651 of FIG. 6) to attach the insulating cover part onto the circuit board.

According to various embodiments of the disclosure, an electronic device (e.g., 100 of FIG. 1) including: a housing including a front plate, a rear plate facing a direction that is opposite to the front plate, and a side surface surrounding a space between the front plate and the rear plate; a circuit board located in the interior of the housing and including at least one electronic component; at least one wiring line disposed in the circuit board; at least one conductive structure disposed on the circuit board to reinforce the circuit board; and at least one conductive member disposed in the circuit board and electrically connecting the at least one wiring line and the at least one conductive structure.

According to various embodiments of the disclosure, the circuit board may include: at least one wiring line disposed in the circuit board; and at least one conductive structure disposed on the circuit board to reinforce the circuit board and disposed to electrically connect the at least one wiring line.

According to various embodiments of the disclosure, the circuit board may further include: at least one conductive member included on the circuit board and electrically connecting the at least one wiring line and the at least one conductive structure.

It is noted by those skilled in the art to which the disclosure pertains that the circuit board and the electronic device including the same according to various embodiments of the disclosure, which have been described above, are not limited by the above-mentioned embodiments and the drawings, but may be variously replaced, modified, and changed without departing from the scope of the disclosure.

The invention claimed is:

1. A circuit board comprising: at least one wiring line disposed in the circuit board; at least one conductive structure disposed on the circuit board to reinforce the circuit board; and at least one conductive member disposed in the circuit board and electrically connecting the at least one wiring line and the at least one conductive structure, wherein the at least one wiring line includes a first wiring line and a second wiring line spaced apart from the first wiring line, and wherein the first wiring line and the second wiring line are formed to be electrically separated inside the circuit board, and wherein the at least one wiring line comprises at least one of a power signal wiring line, a control signal wiring line, or a communication signal wiring line.

2. The circuit board of claim 1, wherein the at least one conductive structure comprises a reinforcing part to reinforce the circuit board.

3. The circuit board of claim 2, wherein the reinforcing part comprises steel use stainless (SUS) or lead.

4. The circuit board of claim 1, wherein the at least one conductive member comprises at least one of at least one via hole or at least one connection wiring line.

5. The circuit board of claim 1, wherein the at least one conductive structure comprises at least one bonding member to attach the conductive structure onto the circuit board.

6. The circuit board of claim 1, wherein a surface of the at least one conductive structure comprises at least one of an insulating cover part or an insulating printing layer that covers the conductive structure to insulate the conductive structure.

7. The circuit board of claim 6, wherein the at least one conductive structure comprises at least one first bonding member to attach the conductive structure onto the circuit board, and wherein the insulating cover part comprises a second bonding member to attach the insulating cover part onto the circuit board.

8. The circuit board of claim 1, wherein a spacing space is disposed between the at least one conductive structure and the circuit board.

9. The circuit board of claim 8, wherein at least one electronic component is disposed in the spacing space.

10. The circuit board of claim 9, wherein the at least one conductive structure comprises a shield member configured to shield the at least one electronic component.

11. An electronic device, comprising: a housing comprising a front plate, a rear plate facing a direction that is opposite to the front plate, and a side surface surrounding a space between the front plate and the rear plate; a circuit board located in the interior of the housing and comprising at least one electronic component; at least one wiring line disposed in the circuit board; at least one conductive structure disposed on the circuit board to reinforce the circuit board; and at least one conductive member disposed in the circuit board and electrically connecting the at least one wiring line and the at least one conductive structure, wherein the at least one wiring line includes a first wiring line and a second wiring line spaced apart from the first wiring line, and the first wiring line and the second wiring line are formed to be electrically separated inside the circuit board, and wherein the at least one wiring line comprises at least one of a power signal wiring line, a control signal wiring line, or a communication signal wiring line.

12. The electronic device of claim 11, wherein the at least one conductive structure comprises a reinforcing part to reinforce the circuit board.

13. An electronic device comprising the circuit board of claim 1.

* * * * *